(12) United States Patent
Nagano

(10) Patent No.: US 7,116,746 B2
(45) Date of Patent: Oct. 3, 2006

(54) SYNCHRONOUS CLOCK PHASE CONTROL CIRCUIT

(75) Inventor: Hideo Nagano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 768 days.

(21) Appl. No.: 10/235,957

(22) Filed: Sep. 6, 2002

(65) Prior Publication Data

US 2003/0190004 A1     Oct. 9, 2003

(30) Foreign Application Priority Data

Apr. 3, 2002    (JP)    ............... 2002-101808

(51) Int. Cl.
*H03D 3/24*    (2006.01)

(52) U.S. Cl. .................. 375/373; 375/354; 716/6; 327/141; 713/400; 713/500; 713/600

(58) Field of Classification Search ............... 375/273; 327/161, 291, 293, 295; 365/198
See application file for complete search history.

(56) References Cited

U.S. PATENT DOCUMENTS

| | | | | | |
|---|---|---|---|---|---|
| 5,682,457 | A | * | 10/1997 | Woo et al. ............... | 386/95 |
| 5,911,064 | A | * | 6/1999 | Samsom et al. ........... | 713/501 |
| 6,097,224 | A | * | 8/2000 | Yokomizo ................ | 327/141 |
| 6,173,432 | B1 | * | 1/2001 | Harrison ................. | 716/1 |

FOREIGN PATENT DOCUMENTS

| | | |
|---|---|---|
| JP | 61-70831 | 4/1986 |
| JP | 63-7021 | 1/1988 |
| JP | 63-31212 | 2/1988 |
| JP | 4-29409 | 1/1992 |
| JP | 4-167811 | 6/1992 |
| JP | 4-347931 | 12/1992 |
| JP | 4-363914 | 12/1992 |
| JP | 5-29891 | 2/1993 |
| JP | 5-110388 | 4/1993 |
| JP | 6-338130 | 12/1994 |
| JP | 8-154051 | 6/1996 |
| JP | 9-6462 | 1/1997 |
| JP | 10-13219 | 1/1998 |
| JP | 11-346145 | 12/1999 |
| JP | 2000-198235 | 7/2000 |
| JP | 2001-236783 | 8/2001 |
| JP | 2001-308687 | 11/2001 |

OTHER PUBLICATIONS

Moon, Y. et al, An all-analog multiphase delay-locked loop using a replica delay line for wide-range operation and low-jitter performance, Mar. 2000, IEEE Journal of Solid State Circuits, vol. 35, No. 3, pp. 377-384.*

* cited by examiner

*Primary Examiner*—Mohammad Ghayour
*Assistant Examiner*—Adolf DSouza
(74) *Attorney, Agent, or Firm*—Buchanan Ingersoll & Rooney PC

(57) ABSTRACT

A synchronous clock phase control circuit includes a T/8 step phase clock generation unit, a phase selection unit, and four synchronous clock generation units. The T/8 step phase clock generation unit generates eight clocks previously delayed in phase by T/8 from an input clock. The phase selection unit selects four control clocks from the eight clocks generated by the phase clock generation unit based on four phase control signals, respectively. The four synchronous clock generation units synchronize the selected clocks with an externally input trigger signal TR using the input clock as a reference, and output the selected clocks when synchronization is established, respectively.

6 Claims, 5 Drawing Sheets

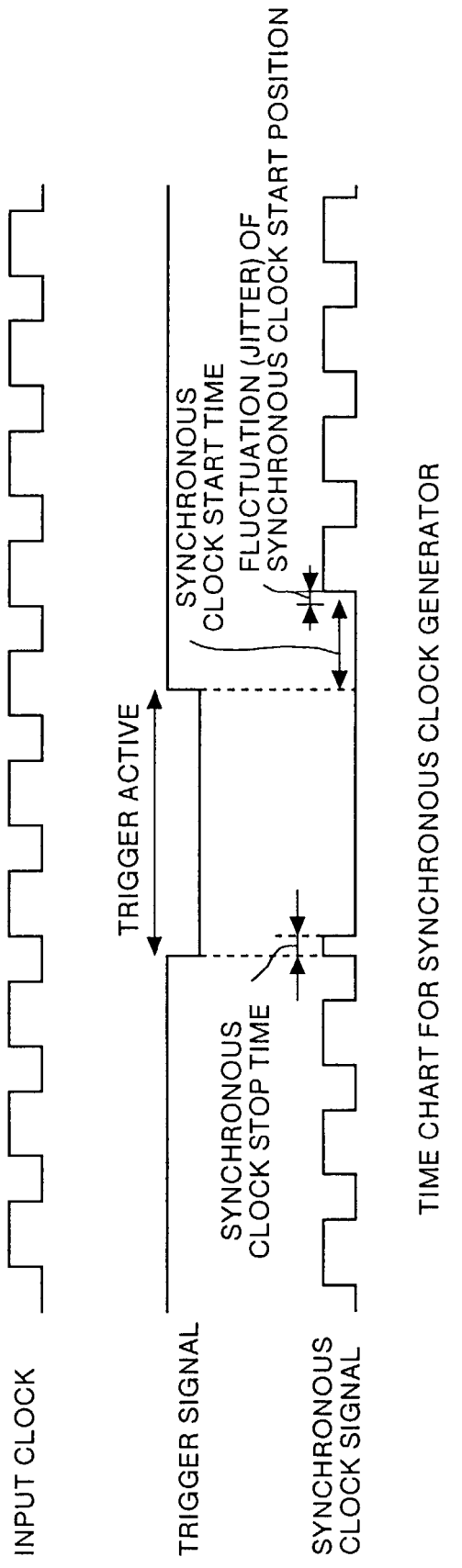

SYNCHRONOUS CLOCK PHASE CONTROL CIRCUIT

BACKGROUND OF THE INVENTION

1) Field of the Invention

The present invention relates to a synchronous clock phase control circuit which controls a clock signal to conduct printing control in a color copier, a laser beam printer, or the like.

2) Description of the Related Art

In printing control in a copier, a laser printer or the like, a clock signal synchronized with a trigger signal is used to control a print region on a sheet for each line. FIG. 5 is an input/output signal time chart for a synchronous clock generator which generates a clock signal synchronized with a trigger signal using an input clock. In FIG. 5, the trigger signal is a low active signal. When the trigger signal is of low logical level ("Low"), the trigger signal becomes effective (asserted) to stop the output of a synchronous signal. When the trigger signal is changed (negated) from "Low" to high logical level ("High"), a synchronous signal synchronized with the trigger signal is output after the passage of predetermined synchronous clock start time from a point of this change. Using this synchronous signal, line control over the print region on the sheet is conducted.

Since a monochrome copier or a monochrome printer prints only one color, the print region on the sheet can be controlled using one synchronous clock signal. However, a color copier or a color laser beam printer requires a total of four synchronous clock signals for Y (yellow), M (magenta), C (cyan), and K (black). According to the printing technique used in the color copier, the color laser beam printer or the like, various colors are realized by the subtractive color mixture of three primary colors of Y, M and C. In principle, all colors can be realized from the three primary colors. However, if a black color is realized by the mixture of the three colors, resultant black becomes somber. Therefore, four colors of three colors of Y, M and C and a color K are used in many cases and these colors are printed in the order of Y, M, C, and K. In addition, since the color copier or the color laser beam printer requires a high degree of image processing, it is necessary that the four synchronous clock signals have different delays (phases) from one synchronous clock in order to control four-color printing. Specifically, if a Y control clock having a cycle T is set as a reference, it is necessary that an M control clock has a delay of T/n, a C control clock has a delay of 2T/n, a K control clock has a delay of 3T/n each having a cycle T. Further, these four clocks should be synchronous clocks synchronized with a trigger signal.

However, it is difficult to obtain four synchronous clock signals having different phases from a single trigger signal asynchronous with an input clock. To do so, conventionally, a trigger signal is set for each color or the fine adjustments of clock delays are conducted using an exterior element. Therefore, a clock control circuit becomes disadvantageously complicated and the number of elements disadvantageously increases.

SUMMARY OF THE INVENTION

It is an object of the present invention to provide a synchronous clock phase control circuit which can control the phases of a plurality of clocks for printing control in a color copier or a color laser printer by using a single trigger input.

The synchronous clock phase control circuit according to this invention includes a phase clock generation unit which generates "n" clock signals delayed by T/n×0, T/n×1, ... and T/n×(n−1), where n is >1, n is an integer and T is a cycle, from a reference signal and thereby having different phase delays, respectively, using an input clock signal having a cycle T input from externally as the reference clock signal. The synchronous clock phase control circuit also includes a phase selection unit which selects "m" clock signals having different phases from the "n" clock signals having the different phases and generated by the phase clock generation unit, based on "m" control signals input from externally, respectively, where m>1 and m is an integer. The synchronous clock phase control circuit further includes "m" clock selection units each of which selects one of the externally input clock signal and the clock signal selected by the corresponding phase selection unit, based on a corresponding detection signal, and "m" synchronous clock generation units which synchronize the clock signals selected by the clock selection units with a trigger signal asynchronous with the externally input clock signal, and output the synchronous clock signals, respectively. The synchronous clock phase control circuit further includes "m" synchronous detection units which detect synchronization of the clock signals output from the synchronous clock generation units with the trigger signal, and output the corresponding detection signal to the "m" clock selection units when synchronization is detected.

Other objects and features of this invention will become apparent from the following description with reference to the accompanying drawings.

BRIEF DESCRIPTION OF THE DRAWINGS

FIG. 5 is a time chart for a conventional synchronous clock generator.

DETAILED DESCRIPTION

Embodiments of the synchronous clock phase control circuit according to the present invention will be explained hereinafter in detail with reference to the accompanying drawings.

Figure 1:
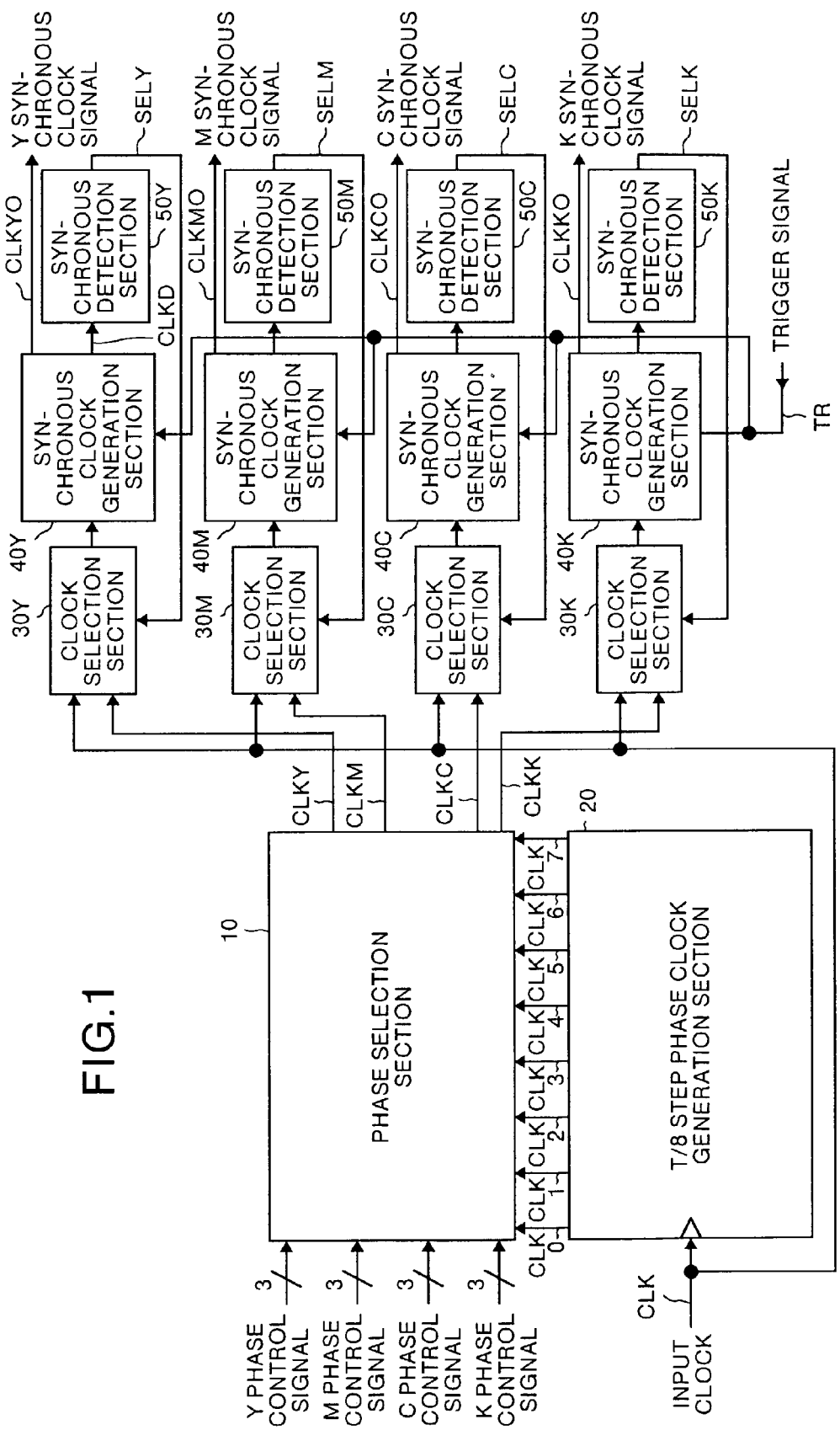
FIG. 1 is a block diagram which shows the configuration of a synchronous clock phase control circuit in a first embodiment of this invention.
Figure 2:
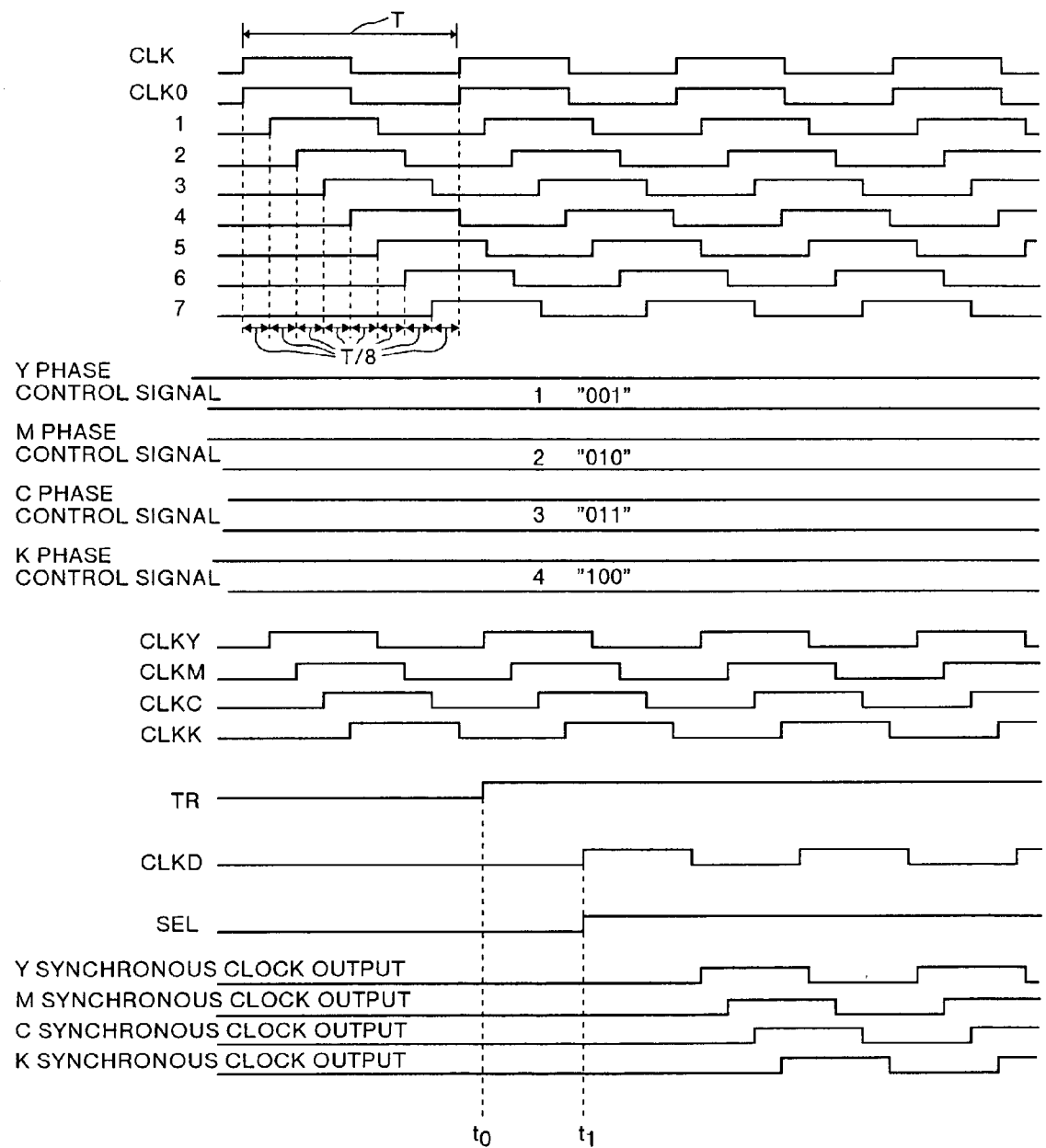
FIG. 2 is a time chart which explains the operation of the synchronous clock phase control circuit in the first embodiment.
Figure 3:
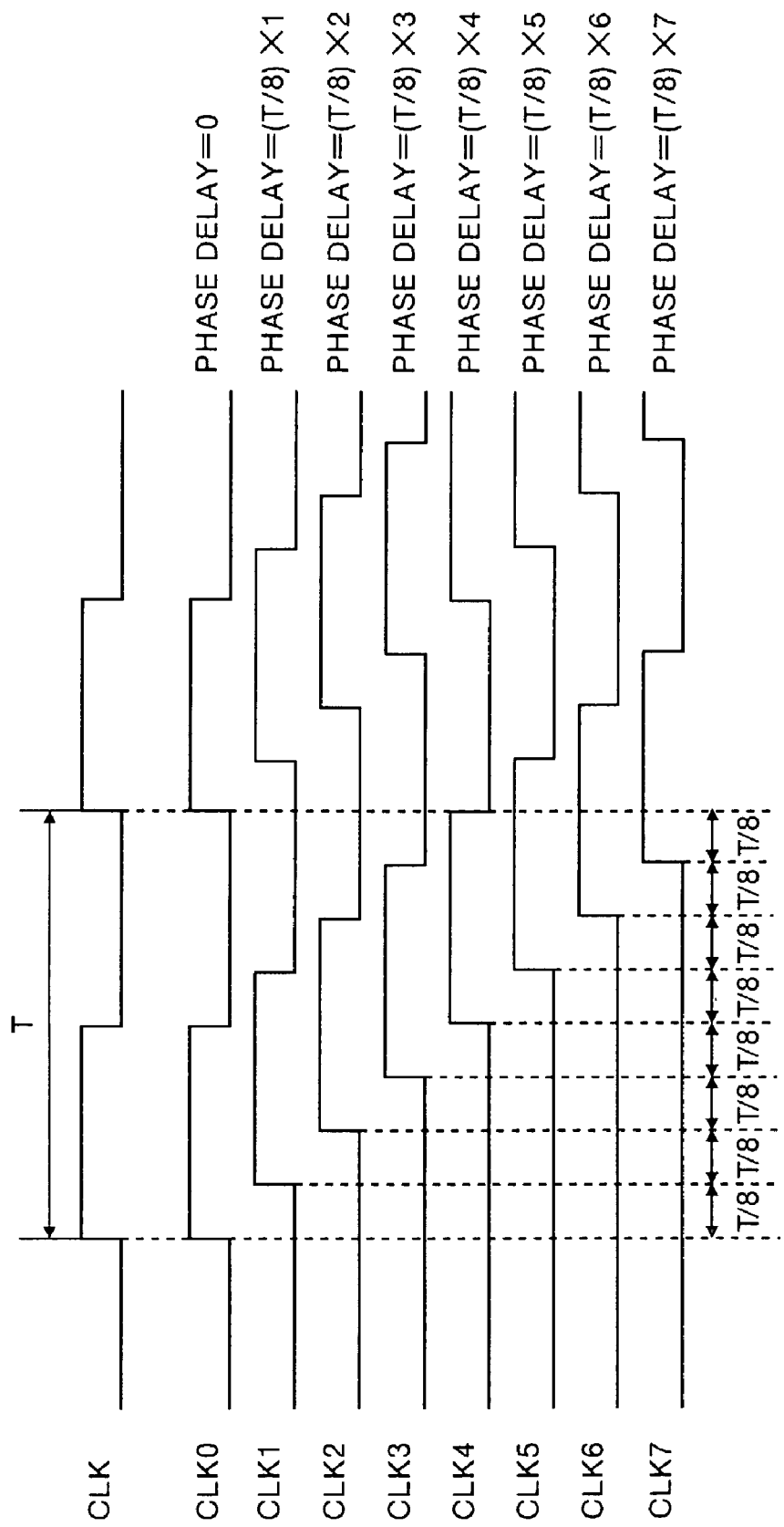
FIG. 3 is a time chart which explains the operation of a T/8 step phase clock generation section shown in FIG. 1.

A first embodiment of the present invention will be explained with reference to FIG. 1 to FIG. 3. FIG. 1 is a block diagram which shows the configuration of a synchronous clock phase control circuit in the first embodiment. The synchronous clock phase control circuit in the first embodiment includes a phase selection section 10, a T/8 step phase clock generation section 20, clock selection sections 30Y, 30M, 30C and 30K, synchronous clock generation sections 40Y, 40M, 40C and 40K, and synchronous detection sections 50Y, 50M, 50C and 50K.

The phase selection section 10 selects clocks from eight clock inputs CLK0 to CLK7 which are input from the T/8 step phase clock generation section 20, based on a Y phase control signal, an M phase control signal, a C phase control signal and a K phase control signal which are external input signals for designating the phases of clocks for Y, M, C and K, respectively. The phase selection section 10 outputs a clock CLKY selected by the Y phase control signal, a clock CLKM selected by the M phase control signal, a clock CLKC selected by the C phase control signal, and a clock CLKK selected by the K phase control signal, to the clock selection sections 30Y, 30M, 30C and 30K, respectively.

The T/8 step phase clock generation section 20 generates eight clocks delayed by T/8×0, T/8×1, . . . and T/8×7, respectively, from an input clock CLK having a cycle T serving as a reference clock.

The clock selection sections 30Y, 30M, 30C and 30K shown in FIG. 1 have the same function. The clock selection section 30Y selects the input clock CLK or the clock CLKY output from the phase selection section 10 based on a select signal SELY output from the synchronous detection section 50Y, and outputs the selected clock to the synchronous clock generation section 40Y.

The synchronous clock generation sections 40Y, 40M, 40C and 40K shown in FIG. 1 have the same function. As shown in FIG. 5, the synchronous clock generation section 40Y generates a synchronous clock signal CLKD synchronized with a trigger signal TR which is input from externally, from the clock which is output from the clock selection section 30Y using the trigger signal TR, and outputs the generated synchronous clock signal CLKD to the synchronous detection section 50Y.

The synchronous detection sections 50Y, 50M, 50C and 50K shown in FIG. 1 have the same function. The synchronous detection section 50Y detects that the synchronous clock generation section 40Y outputs the synchronous clock signal CLKD synchronized with the trigger signal TR, and outputs the detection signal SELY to the clock selection section 30Y.

The operation of the synchronous clock phase control circuit in the first embodiment will next be explained with reference to the time charts shown in FIG. 2 and FIG. 3. FIG. 2 is the time chart for the entire synchronous clock phase control circuit in the first embodiment. FIG. 3 is the time chart which shows a phase relationship among the clocks CLK0 to CLK7 generated in the T/8 step phase clock generation section 20 and the input clock CLK.

The T/8 step phase clock generation section 20 generates the eight clocks CLK0 to CLK7 which include the clock CLK0 equal in phase to a reference clock and which have phase delays of T/8×0, T/8×1, . . . and T/8×7, respectively from the reference clock which is the input clock CLK, and outputs the generated clocks CLK0 to CLK7 to the phase selection section 10.

In this instance, "001", "010", "011" and "100" are input as the Y phase control signal, M phase control signal, C phase control signal and K phase control signal, respectively. Therefore, the phase selection section 10 selects the clocks CLK1, CLK2, CLK3 an CLK4 as the Y clock CLKY, M clock CLKM, C clock CLKC and K lock CLKK, respectively, and outputs the selected clocks to the clock selection sections 30Y, 30M, 30C and 30K, respectively.

Before time $t_0$, the trigger signal TR is negated. Therefore, the synchronous detection sections 50Y, 50M, 50C and 50K do not detect clock synchronization before time $t_0$. During this period, therefore, the clock selection section 30Y outputs the input clock CLK, out of the input clock CLK and the Y clock CLKY, to the synchronous generation section 40Y. The same thing is true for the other clock selection sections 30M, 30C and 30K. The clock selection sections 30M, 30C and 30K select the input clock CLK and output the input clock CLK to the synchronous clock generation sections 40M, 40C and 40K, respectively.

When the trigger signal TR is negated at the time $t_0$, the synchronous clock generation section 40Y generates a synchronous clock CLKD synchronized with the trigger signal TR based on the clock (which is the input clock CLK in this instance) output from the clock selection section 30Y and outputs the generated synchronous clock CLKD to the synchronous detection section 50Y as in the instance of the time chart for the synchronous generator shown in FIG. 5. Likewise, the synchronous clock generation sections 40M, 40C, and 40K generate respective synchronous clocks synchronized with the trigger signal TR based on the clock output from the clock selection sections 30M, 30C, 30K and output the generated synchronous clocks to the synchronous detection sections 40M, 40C, and 40K, respectively.

When detecting the rise of the synchronous clock CLKD output from the synchronous clock generation section 40Y (at time $t_1$), the synchronous detection section 50Y changes the clock select signal SELY output to the clock selection section 30Y so as to select the Y clock CLKY which is output from the phase selection section 10 (changes the clock select signal SELY from "Low" to "High" in this instance). Likewise, the synchronous detection sections 50M, 50C and 50K change the clock select signals SELM, SELC and SELK output to the clock selection sections 30M, 30C and 30K so as to select the M clock CLKM, C clock CLKC and K clock CLKK which are output from the phase selection section 10, respectively. As a result, the Y clock CLKY (clock CLK1), M clock CLKM (clock CLK2), C clock CLKC (clock CLK3) and K clock CLKK (clock CLK4) are output from the clock selection sections 30Y, 30M, 30C and 30K, respectively.

The synchronous clock generation section 40Y outputs the Y clock CLKY, which is input from the clock selection section 30Y, as a Y synchronous clock signal CLKY0. Likewise, the synchronous clock generation sections 40M, 40C and 40K output the M clock CLKM, C clock CLKC and K clock CLKK as an M synchronous clock signal CLKM0, a C synchronous clock signal CLKC0 and a K synchronous clock signal CLKK0, respectively.

As explained above, in the first embodiment, the T/8 step phase clock generation section 20 generates the eight clocks having phase delays of T/8×0, T/8×1, . . . and T/8×7, respectively from the input clock in advance. The phase selection section 10 selects the Y, M, C and K control clocks based on the Y, M, C and K phase control signals, respectively, from the eight clocks generated in the T/8 step phase clock generation section 20. The Y, M, C and K synchronous clock generation sections 40Y, 40M, 40C and 40K synchronize the clocks output from the clock selection sections 30Y, 30M, 30C and 30K with the trigger signal TR which is input from externally with reference to the input clock, and output the selected Y, M, C and K control clocks at the time at which synchronization is established, respectively. Therefore, it is possible to output four clocks having different delays and synchronized with a trigger input using the single trigger input without making external adjustments.

The number of generated clocks having different phase delays from the input clock as a reference is not limited to eight but may satisfy delays T/n (n>1, n is an integer) obtained by evenly dividing the cycle T of the input clock with the "n" clocks.

The number of control signals input from externally is not limited to four (Y, M, C, K phase control signals) but may be an arbitrary number "m" (m>1, m is an integer) Following this, the number of clock signals having different phases, the number of clock selection sections, the number of synchronous clock generation sections, and the number of synchronous detection sections may be "m".

A second embodiment of the present invention will be explained with reference to FIG. 4. The second embodiment is intended to realize the T/8 step phase clock generation section 20 which generates eight clocks having phase delays of T/8×0, T/8×1 . . . and T/8×7, respectively with reference to the input clock in the first embodiment, by a delay locked loop (DLL) circuit.

Figure 4:
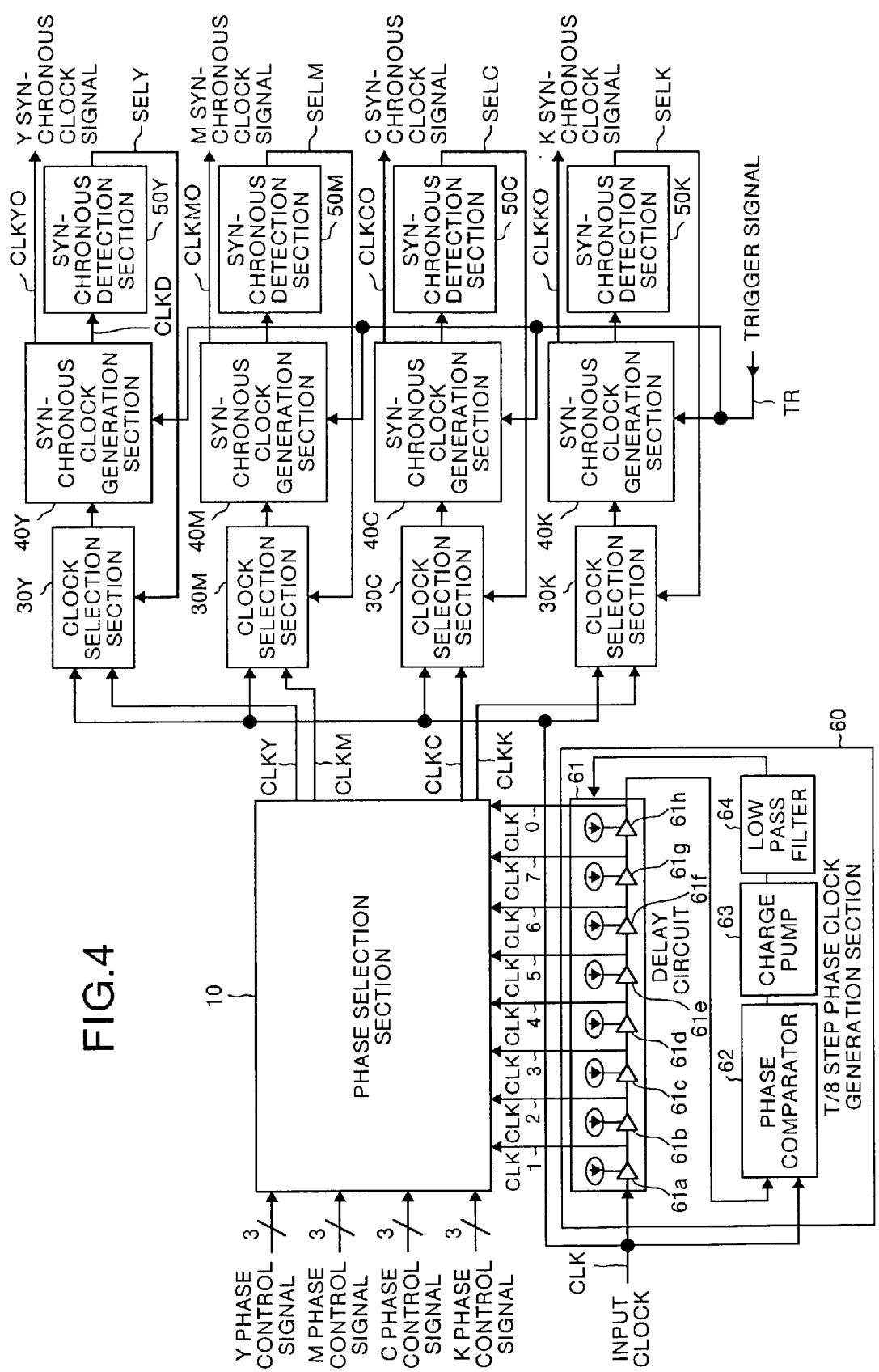
FIG. 4 is a block diagram which shows the configuration of a synchronous clock phase control circuit in a second embodiment of this invention.

FIG. 4 is a block diagram which shows the configuration of a synchronous clock phase control circuit in the second embodiment. Constituent sections equal in function to those in the first embodiment of FIG. 1 are denoted by the same reference symbols, respectively and will not be repeatedly explained herein.

A T/8 step phase clock generation section 60 includes a delay circuit 61, a phase comparator 62, a charge pump 63, and a low pass filter 64.

The delay circuit 61 consists of eight delay elements 61a to 61h each of which can arbitrarily change the delay of an input signal. These delay elements 61a to 61h delay the phase of the input clock having a cycle T by T/8×0, T/8×1, . . . and T/8×7 and outputs eight clocks, respectively.

The phase comparator 62 compares the phase of the input clock with that of the clock output of the last delay element of the delay circuit 61, and outputs a difference component in phase between the two clocks as a pulse-like phase difference signal.

The charge pump 63 boosts the phase difference signal which is output from the phase comparator 62 up to the level with which the delay circuit 61 can make a delay adjustment.

The low pass filter 64 cuts off the high frequency components of the phase difference signal boosted by the charge pump 63, and outputs a delay control signal to the delay circuit 61.

The operation of the synchronous clock phase control circuit in the second embodiment will next be explained. An input clock CLK is input to each of the delay circuit 61 and the phase comparator 62 in the T/8 step phase clock generation section 60. The input clock CLK input to the delay circuit 61 is delayed in phase by T/8×0, T/8×1, . . . and T/8×7, from the cycle T of the input clock CLK by the delay elements 61a to 61h, respectively, and eight clocks CLK0 to CLK7 which include the clock CLK0 equal in phase to the input clock CLK are generated. The generated eight clocks CLK0 to CLK7 are output to the phase selection section 10.

The phase comparator 62 compares the phase of the input clock CLK with that of the clock CLK0 which has passed through the last delay element 61h of the delay circuit 61. Since the clock CLK0 has passed through the eight delay elements (61a to 61h) each having a delay T/8, the delay of the clock CLK0 is (T/8)×8=T, which means the clock CLK0 must be equal in phase to the input clock CLK. If the phase of the clock CLK0 is delayed from that of the input clock CLK, it is necessary to make a fine adjustment to reduce the respective delays of the delay elements 61a to 61h of the delay circuit 61. If the phase of the clock CLK0 advances from that of the input clock CLK, it is necessary to make a fine adjustment to increase the respective delays of the delay elements 61a to 61h of the delay circuit 61. The phase comparator 62 compares the phase of the input clock CLK with that of the clock CLK0 and outputs a phase difference component signal to the charge pump 63.

The charge pump 63 boosts the phase difference component signal which is output from the phase comparator 62 up to the level with which the delays of the delay elements 61a to 61h of the delay circuit 61 can be adjusted. The high frequency components of the phase difference component signal boosted by the charge pump 63 are removed by the low pass filter 64 and the resultant signal is input to the delay circuit 61. The delay circuit 61 adjusts the delay elements 61a to 61h so that the each element has a delay T/8, based on the phase difference component signal output from the low pass filter 64.

The phase selection section 10 selects a corresponding number of clocks out of the eight clocks having phase delays of T/8×0, T/8×1, . . . and T/8×7 output from the T/8 step phase clock generation section 60 based on Y, M, C and K phase control signals, respectively. The trigger signal TR is negated. The synchronous clock generation sections 40Y, 40M, 40C and 40K generate clocks synchronized with the trigger signal TR with reference to the input clock CLK which is selected by the clock selection sections 30Y, 30M, 30C and 30K, respectively. The synchronous detection sections 50Y, 50M, 50C and 50K detect that the clocks synchronized with the trigger signal TR are generated, change the input clock CLK to the clocks selected by the phase selection section 10, generate clocks synchronized with the trigger signal TR and output four clocks having different delays, i.e., a Y synchronous clock signal CLKY0, an M synchronous clock signal CLKMO, a C synchronous clock signal CLKCO and a K synchronous clock signal CLKKO, respectively. Since these operations are the same as those in the first embodiment explained with reference to the time chart shown in FIG. 2, they will not be explained herein.

The applicant of the present application already filed the inventions related to clock generation circuits. Each of these clock generation circuits, disclosed in Japanese Patent Application Laid-Open Nos. 4-363914, 5-110388 and 5-029891, has high synchronization accuracy without using a high frequency clock, and generates an output clock signal shifted by substantially constant time from the fall of an asynchronous trigger signal even if the asynchronous trigger signal is supplied at whichever timing for a basic clock signal which serves as a reference clock. If any of these clock generation circuits is applied to the synchronous clock generation sections 40Y, 40M, 40C and 40K of the present invention, it is possible to generate clocks having different delays and synchronized with a single trigger as control clocks for the respective colors of Y, M, C and K without using a high frequency clock.

As explained above, in the second embodiment, the T/8 step phase clock generation section 60 is realized by the DLL circuit. The T/8 step phase clock generation section 60 generates the eight clocks delayed in phase by T/8×0, T/8×1, . . . and T/8×7 from the input clock, respectively, in advance. The phase selection section 10 selects the Y, M, C and K control clocks in accordance with the Y, M, C and K phase control signals, respectively from the eight clocks generated by the T/8 step phase clock generation section 60. The Y, M, C and K synchronous clock generation sections 40Y, 40M, 40C and 40K generate synchronous clocks synchronized with the externally input trigger signal TR using the input clock as a reference, and output the selected Y, M, C and K control clocks at the time at which synchronization is established, respectively. It is, therefore, possible to output the four clocks having different delays and synchronized with a single trigger input by using the single trigger input as control clocks for the respective colors of Y, M, C and K.

By realizing the T/8 step phase clock generation section 60 by the DLL circuit and applying the clock generation circuit which has been already filed by the applicant of the present application to each of the synchronous clock generation sections 40Y, 40M, 40C and 40K, it is possible to realize the synchronous clock phase control circuit of the present invention as a single-chip LSI.

As explained so far, according to the synchronous clock phase control circuit of the present invention, "n" clocks having different phases delayed by T/n×0, T/n×1, . . . and T/n×(n−1) (n>1, n is an integer, and T is a cycle) from an input clock signal having a cycle T which serves as a reference clock, respectively. From the "n" clocks, "m" delay clocks (m>1, m is an integer) are selected. If a trigger signal asynchronous with the input clock signal is negated, synchronous clocks synchronized with the trigger signal are generated using the reference clock. After synchronization is established, the "m" clocks selected in advance are output. It is, therefore, possible to obtain a plurality of clocks having different delays and synchronized with a single trigger using the single trigger input without making external fine adjustments.

Moreover, since the DLL circuit is employed as the phase clock generation section, it is possible to realize the synchronous clock phase control circuit as a single-chip LSI.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A synchronous clock phase control circuit comprising:
    a phase clock generation unit which generates "n" clock signals delayed by T/n×0, T/n×1, . . . and T/n×(n−1), where n>1, n is an integer and T is a cycle, from a reference clock signal and thereby having different phase delays, respectively, using an input clock signal having a cycle T input from externally as the reference clock signal;
    a phase selection unit which selects "m" clock signals having different phases from the "n" clock signals having the different phases and generated by the phase clock generation unit, based on "m" control signals input from externally, respectively, where m>1 and m is an integer;
    "m" clock selection units each of which selects one of the externally input clock signal and the clock signal selected by the corresponding phase selection unit, based on a corresponding detection signal;
    "m" synchronous clock generation units which synchronize the clock signals selected by the clock selection units with a trigger signal asynchronous with the externally input clock signal, and output the synchronous clock signals, respectively; and
    "m" synchronous detection units which detect synchronization of the clock signals output from the synchronous clock generation units with the trigger signal, and output the corresponding detection signal to the "m" clock selection units when synchronization is detected.

2. The synchronous clock phase control circuit according to claim 1, wherein a delay locked loop circuit is employed as the phase clock generation unit.

3. The synchronous clock phase control circuit according to claim 2, wherein the delay locked loop circuit includes:
    a delay circuit which consists of "n" delay elements each of which can arbitrarily change a delay of an input clock signal, the delay elements generating "n" clock signals delayed by T/n×0, T/n×1, . . . and T/n×(n−1), where n>1, n is an integer and T is a cycle, from a reference clock signal and thereby having different phase delays, respectively, using the input clock signal having a cycle T input from externally as the reference clock signal, and outputting the "n" clock signals,
    a phase comparator which compares a phase of the input clock signal with that of a clock output from a last delay element of the delay circuit, and outputs a difference component in phase between the two clocks as a pulse-like phase difference signal,
    a charge pump which boosts the phase difference signal which is output from the phase comparator up to a level with which the delay circuit can make a delay adjustment, and
    a low pass filter which cuts off a high frequency components of the phase difference signal boosted by the charge pump, and outputs a delay control signal to the delay circuit.

4. The synchronous clock phase control circuit according to claim 3, wherein each of the delay elements in the delay circuit delays the clock signal to be output by T/n based on the phase difference signal.

5. The synchronous clock phase control circuit according to claim 1, wherein "m"≦4.

6. The synchronous clock phase control circuit according to claim 5, the control signals are selected from a control signal having a phase corresponding to yellow, a control signal having a phase corresponding to magenta, a control signal having a phase corresponding to cyan, and a control signal having a phase corresponding to black.

* * * * *